United States Patent [19]

Andrews

[11] Patent Number: 5,706,201

[45] Date of Patent: Jan. 6, 1998

[54] SOFTWARE TO DETERMINE THE POSITION OF THE CENTER OF A WAFER

[75] Inventor: J. Randolph Andrews, Campbell, Calif.

[73] Assignee: Fortrend Engineering Corporation, Sunnyvale, Calif.

[21] Appl. No.: 643,908

[22] Filed: May 7, 1996

[51] Int. Cl.$^6$ .................. G06F 19/00; G06G 7/64; G06G 7/66

[52] U.S. Cl. .................. 364/468.15; 364/468.01; 364/468.17; 364/468.22

[58] Field of Search ............ 364/468.01, 468.15, 364/550, 167.01, 571.05; 117/20; 414/783, 936, 786

[56] References Cited

U.S. PATENT DOCUMENTS

| | | | |
|---|---|---|---|
| 4,685,206 | 8/1987 | Kobayashi et al. | 29/740 |
| 4,750,141 | 6/1988 | Judell et al. | 364/550 |
| 4,752,898 | 6/1988 | Koenig | 364/559 |
| 4,819,167 | 4/1989 | Cheng et al. | 364/167.01 |
| 5,238,354 | 8/1993 | Volovich | 414/779 |
| 5,511,934 | 4/1996 | Bacchi et al. | 414/783 |
| 5,513,948 | 5/1996 | Bacchi et al. | 414/783 |

*Primary Examiner*—Reba I. Elmore
*Assistant Examiner*—Ramesh Patel
*Attorney, Agent, or Firm*—The Kline Law Firm

[57] ABSTRACT

A computer program that evaluates data to determine the position of the center of a wafer. The program processes data generated by gate sensors that detect points on the wafer's outer edge. The sensors provide information about a leading and a trailing edge of the wafer. The program then determines if the data points are those on the circular perimeter of the wafer so that points on the flat or notch may be eliminated from the calculation of the center point.

1 Claim, 2 Drawing Sheets

A=MEASURED VECTOR
B=MEASURED VECTOR
C=MAGNITUDE(A-B)/2,ANGLE(A-B)
D=MAGNITUDE(SQRT(RADIUS^2-MAGNITUDE(C)^2),ANGLE(C)+/-90
CENTER=B+C+D

SOFTWARE TO DETERMINE THE POSITION OF THE CENTER OF A WAFER

FIELD OF THE INVENTION

The present invention relates generally to prealigning mechanisms for wafer sorting, and more particularly is a software program that determines the center point of a wafer.

BACKGROUND OF THE INVENTION

In the manufacture of integrated circuits, various processes are required to be performed on the silicon wafer that is the substrate of the chips. During manufacture, the wafer is processed from a circular substrate of silicon to a finished wafer containing multiple chips. Wafers are transported in carriers, termed boats or cassettes, to the various operations that are to be performed on the wafer. Individual wafers within the boat are sorted depending upon which operation is to be next performed on the wafer, or on what the disposition of a given wafer might be.

Sorting wafers is a time consuming process. The wafers must be removed from the cassette and positioned so that the identifying information on the wafer can be read. In order for a process operation to be performed on the wafer, it must be accurately positioned on a chuck. Sorting of the wafers may be required several times during the fabrication process.

Therefore, there have been many efforts in the industry to address the problems inherent in handling and sorting wafers. The current state of the art for sorting individual wafers is to use a prealigner to determine the orientation of the wafer, and to then properly position the wafer. Prealigners currently available generally assume that the wafer will be placed on a chuck in a non-centered position. The wafer is spun to determine its eccentricity, and then repositioned in a centered orientation. This method of operation is not only fairly complex, but also requires a two-step positioning operation. An example of this type of operation is U.S. Pat. No. 5,238,354, issued Aug. 24, 1993 to Volovich for "Semiconductor Object PreAligning Apparatus".

Another method of prealignment is to map the position of the wafer in its non-centered orientation, then use that map to drive an independent positioning means to position the wafer. This allows the user to position the wafer without loading it into the prealigner twice, but does require the independent positioning means. This greatly complicates the positioning operation. This method is exemplified by U.S. Pat. No. 5,308,222, issued May 3, 1994, to Bacchi et al, for "Noncentering Specimen Prealigner".

OBJECTS, SUMMARY, AND ADVANTAGES OF THE INVENTION

Accordingly, it is an object of the present invention to provide a means for determining the position of the center of a wafer by evaluating data provided by a plurality of gate sensors.

In summary, the present invention is a computer program that evaluates data to determine the position of the center of a wafer. The program processes data generated by gate sensors that detect points on the wafer's outer edge. The sensors are positioned so that the wafer passes through them as it is being positioned on a prealigner. The sensors can therefore provide information about a leading and a trailing edge of the wafer during the normal translational movement of the wafer during the sorting process. The program then determines if the data points are those a full radius away from a proposed center of the wafer so that points on the flat or notch may be eliminated from the calculation of the actual center point. Adjustment of the wafer's position is then made as the wafer is mounted on the prealigner chuck.

An advantage of the present invention is that the wafer is sensed and centered without being released from the robot pickup.

Another advantage of the present invention is that the wafer can be prepared for OCR scanning in a single operation.

These and other objects and advantages of the present invention will become apparent to those skilled in the art in view of the description of the best presently known mode of carrying out the invention as described herein and as illustrated in the drawings.

BEST MODE OF CARRYING OUT THE INVENTION

The present invention is a computer program that evaluates data to determine the position of the center of a wafer. The program is used to facilitate the prealignment of a wafer in a wafer sorting system. The program uses data supplied by sensors in the sorting system that provide information as to the location of a leading and a trailing edge of a wafer.

Figure 1:
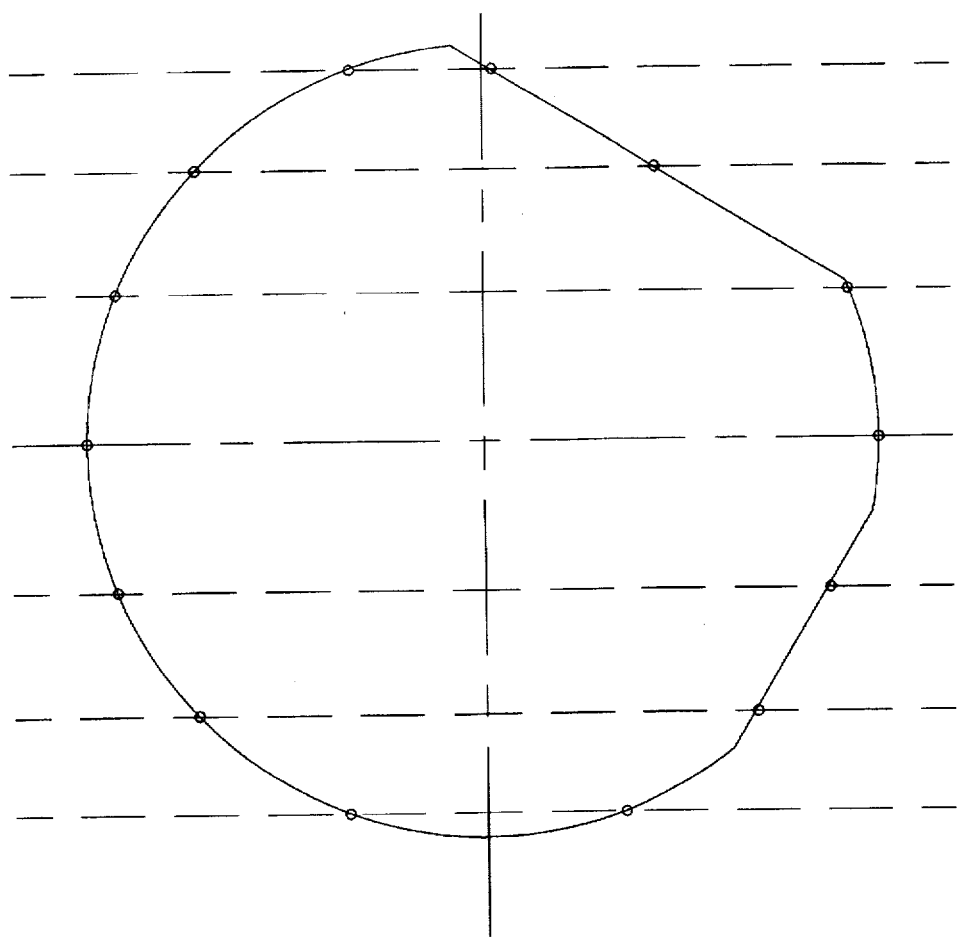
FIG. 1 depicts the points on the wafer's perimeter that are detected by the sensors of the sorting system.

As shown in FIG. 1, the sorter's sensors provide the program information as to the position of points on the leading and trailing edges of a wafer passing through the sensors of the sorter.

The program then determines if the data points lie a full radius away from a proposed center point so that points on the flat or notch may be eliminated from the calculation of the actual center point. The pseudo code and source code for the program is appended hereto, after the following step-by-step description of the program.

A. Collect_Edge_Vectors_From_Gate_Sensors.

The first step of the program is to simply collect the available data. The program assumes the presence of a plurality of data points generated by sensors. While any sensor system that provides information as to the location of the edge of an object may be used, in the preferred embodiment, it is assumed that data is provided from the outputs of gate sensors. (Gate sensors being defined as light through-beam sensors that provide a signal when broken by a leading or a trailing edge of a wafer.) The data points are generated from the positions depicted in FIG. 1.

B. Arrange_Edge_Points_Into_Adjacent_Point_Pairs.

The data points collected must be placed in circumferential order in order to ultimately calculate a center point. Arbitrary pairing would not provide optimal information.

C. Fill_In_Center_Construction_Point_Pair_List.

The optimum separation for points is that achieved when the arc between points is approximately 90°. This means that the point pairs must be created with non-adjacent points, e.g. ordinals such as n and n+2, as opposed to n and n+1. If ten data points are available, and the spacing is equidistant about the circumference, the points would be about 36° apart. Thus the point pairs would be chosen as n and n+3 to achieve optimal separation. (3×36°≈90°.)

D. Calculate_Candidate_Center_Point_From_Point_Pair.

Figure 2:
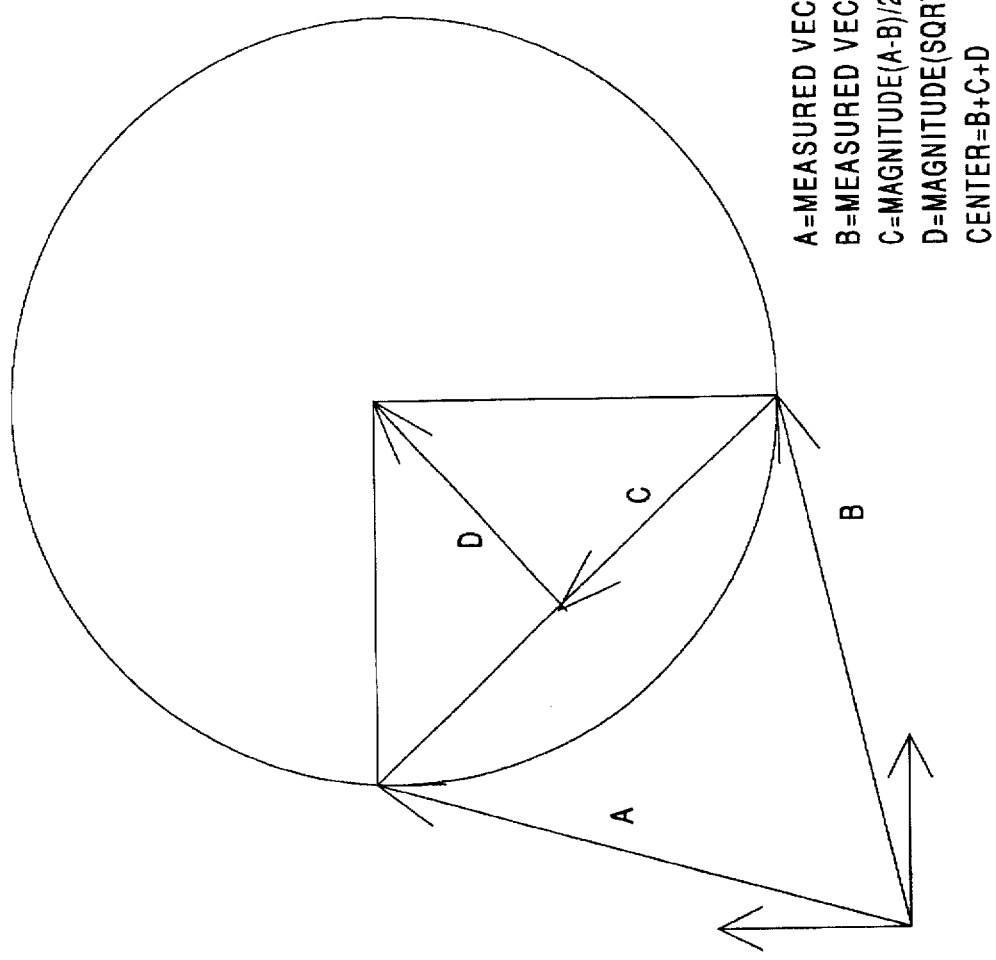
FIG. 2 is a graphical representation of the calculation of the center point of a circle given two points on the circle.

This calculation takes the point pair and calculates a center point. There are two center point solutions for a known radius and two edge points. One solution can be readily eliminated as being outside an area of possible center locations. FIG. 2 illustrates the geometry and center calculation.

E. Score_Candidate_Center_Point_By_Measuring_Remaining_Point_Deviation.

This routine "scores" the calculated center point by iterating through the point list and "rewarding" the calculated center point if the distances from the calculated center point to the points on the list closely approximate the radius.

F. Reject_Candidate_Center_Points_With_Poor_Scores

Given the structure of wafers, i.e. the presence of flats and notches on the perimeter, it is to be expected that a certain number (designated m) of points will lie on those flats or notches. After the candidate center points are scored, the m poorest scored center point pairs are discarded as the quality for those pairs is suspect.

G. Average_Remaining_Candidate_Center_Positions

Following the rejection of the m poorest pairs, the remaining candidate center points should be constructed from edge points which actually lie a radius away from the center point. To reduce the measurement noise impact of any particular point, these center points are averaged for the value of the final calculated center point.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

Following is a listing of the code for the program of the present invention.

I claim:

1. A computer program to determine the position of the center of a wafer comprising the following steps:

(a) collect data in the form of a plurality of data points generated by sensors that determine the location of a leading and a trailing edge of said wafer, (b) place said collected data in circumferential order, (c) create multiple non-adjacent point pairs, said non-adjacent point pairs are created such that an arc between individual points of said non-adjacent point pairs is approximately 90°, (d) calculate a center point based on each said non-adjacent point pair, eliminating one of two possible solutions as falling outside an area of possible actual center locations, (e) score said calculated center point by iterating through said data points, calculating distances from said data points to said calculated center point, and rewarding said calculated center point when said calculated distances are equal to a known radius of said wafer, (f) reject calculated center points that receive low scores, and (g) average the remaining calculated center points to reduce any measurement noise impact of a given data point, thereby arriving at a final calculated center point.

* * * * *